United States Patent [19]

Lantsman

[11] Patent Number: 5,573,597
[45] Date of Patent: Nov. 12, 1996

[54] PLASMA PROCESSING SYSTEM WITH REDUCED PARTICLE CONTAMINATION

[75] Inventor: Alexander D. Lantsman, Middletown, N.Y.

[73] Assignees: Sony Corporation, Tokyo, Japan; Materials Research Corp., Orangeburg, N.Y.

[21] Appl. No.: 478,950

[22] Filed: Jun. 7, 1995

[51] Int. Cl.⁶ ................................................. C23C 16/00
[52] U.S. Cl. ............................ 118/723 MP; 118/723 E; 156/643.1; 216/71
[58] Field of Search ...................... 118/723 MP, 723 E, 118/723 ER; 156/345, 643.1; 204/298.34, 298.06; 216/71

[56] References Cited

U.S. PATENT DOCUMENTS

| | | | |
|---|---|---|---|
| 4,795,880 | 1/1989 | Hayes et al. | 219/121.52 |
| 5,242,561 | 9/1993 | Sato | 204/192.33 |
| 5,294,320 | 3/1994 | Somekh et al. | 204/298.11 |
| 5,449,432 | 9/1995 | Hanawa | 156/643.1 |
| 5,478,429 | 12/1995 | Komino et al. | 156/345 |

*Primary Examiner*—R. Bruce Breneman
*Assistant Examiner*—Joni Y. Chang
*Attorney, Agent, or Firm*—Wood, Herron & Evans, P.L.L.

[57] ABSTRACT

The plasma processing system comprises a processing chamber with a processing space therein to contain a substrate. An electrical element is operable to couple electrical energy into the processing space to generate a plasma and is further operable to interrupt the power to the processing space to extinguish the plasma upon completion of the processing. An electrode positioned inside the chamber is electrically coupled to the substrate and to a DC bias power supply which selectively supplies DC power to the electrode to bias the substrate. A DC bias control circuit coupled to the power supply selectively controls the biasing of the substrate and is operable to briefly supply DC power to the electrode and the substrate proximate the time when the power to the generated plasma is interrupted to momentarily DC bias the substrate such that, as the plasma is extinguished, charged contaminants particles suspended within the plasma are repelled away from the biased substrate to prevent contamination of the substrate.

26 Claims, 2 Drawing Sheets

PLASMA PROCESSING SYSTEM WITH REDUCED PARTICLE CONTAMINATION

FIELD OF THE INVENTION

This invention relates generally to plasma processing of a substrate and particularly to an apparatus and method for reducing particle contamination during plasma processing.

BACKGROUND OF THE INVENTION

When processing semiconductor workpieces or substrates into integrated circuits, excited gas plasmas are often used. For example sputter etching uses a plasma to remove a layer of unwanted material from the substrate surface, while sputter deposition uses a plasma and a target of material to deposit a layer onto the substrate.

The process of sputter etching is generally known and utilizes the ionized particles of a charged gas plasma to bombard the surface of a substrate and dislodge or "sputter" away substrate particles from the surface of the substrate. In sputter etching, a plasma gas is introduced into a processing chamber which is preferably vacuum sealed and which is typically fabricated from quartz, ceramic or another suitable dielectric material. The substrate to be sputter etched is supported on an electrically charged base or electrode within the processing chamber whereon the substrate develops an electrical charge or bias. The plasma gas is introduced into the vacuum chamber opposite the surface of the charged substrate, and energy is coupled to the gas, such as by using an induction coil which surrounds the quartz processing chamber and inductively couples energy through the processing chamber walls. The energy from the induced electric field ionizes the gas particles to form the plasma or plasma cloud which includes particles having a net charge opposite in polarity to the charge of the biased substrate. The ionized particles in the plasma are attracted to the substrate surface, bombarding the surface and dislodging or etching material particles from the substrate.

In sputter deposition, a biased target of material is positioned in the processing chamber generally opposite the substrate. The plasma particles bombard the biased target and dislodge particles of target material which then deposit on the substrate to form a material layer.

Plasma processing is accompanied by the generation of undesired contaminant particles. Particle generation may be due to the plasma chemistry, arcing within the plasma or the processing chamber, and/or the accumulation and peeling of the deposits from surfaces within the processing chamber. Further contaminant particles are created during the plasma etching and plasma sputter deposition processes. The contaminant particles are usually suspended within the generated plasma during processing. However, upon removal of the energy from the plasma and the subsequent extinguishing of the plasma, the contaminant particles are released and some of the particles condense on the surface of the substrate thereby resulting in irreversible particle contamination of the substrate. Particle contamination constitutes one of the major yield limitations in plasma processing of Very Large Scale Integration (VLSI) devices.

It is an objective of the present invention to increase the yield of plasma processes such as plasma etching and plasma sputter deposition of VLSI devices.

Accordingly, it is an objective of the present invention to reduce particle contamination during plasma processing.

Furthermore, it is an objective to prevent released contaminant particles from condensing on the surface of a substrate when a plasma is extinguished.

SUMMARY OF THE INVENTION

The plasma processing system of the present invention addresses the existing drawbacks of current plasma systems and increases the processing yield for VLSI devices by preventing contaminant particles from condensing upon the substrate surface after being released from an extinguished plasma. To that end, the plasma processing system of the invention includes a processing chamber which defines a processing space therein. The processing chamber includes appropriate gas inlets for introducing the plasma gas and appropriate electrical elements, such as an inductive coil, to couple energy to the gas and generate a plasma within the processing space. An electrode base is positioned within the chamber and supports a substrate to be processed.

In one embodiment of the invention, the base electrode is coupled to an RF power supply which is operable to deliver RF power to the electrode for biasing the substrate during plasma processing. In an alternative embodiment of the invention, the electrode is coupled to a ground potential source to ground the substrate during processing.

A DC bias power supply is coupled to the base electrode for selectively supplying DC power to the electrode to DC bias the substrate. A DC bias control circuit is connected to the DC bias power supply and selectively controls the biasing of the substrate during processing to prevent the condensation of contaminant particles on the substrate surface. Specifically, the DC bias control circuit is normally operable to interrupt the DC power supplied to the electrode and substrate when the plasma is being generated. However, the control circuit may supply DC to the electrode if necessary for a particular type of processing. In either case, the DC bias power supply is operated so that it does not adversely affect the plasma processing, such as plasma etching or plasma sputter deposition.

When the plasma processing is complete and the electrical energy sustaining the plasma is interrupted, the DC bias control circuit is further operable to cause the DC power supply to briefly provide DC power to the electrode and substrate and momentarily DC bias the substrate as the plasma is extinguished. The contaminant particles contained with the plasma are generally charged. The substrate is momentarily DC biased such that, as the plasma is extinguished, the charged contaminant particles, which would normally condense upon the substrate surface, are repelled by the substrate to prevent contamination of the substrate.

Recent studies have shown that particles generated by plasma systems generally have a negative charge. Therefore, in one preferred embodiment of the invention, the electrode and substrate are coupled to the negative terminal of the DC bias power supply. The negative terminal is coupled through a commutator switch which is controlled by the DC bias control circuit. The output of the commutator switch is connected to the base electrode and when the switch is closed, power is supplied to the base electrode to negatively DC bias the substrate. The DC bias control circuit operates to briefly close the commutator switch for a few seconds at the end of plasma processing, and then the control circuit opens the commutator switch to isolate the DC bias power supply from the base electrode and interrupt the DC power flow to the substrate. The DC bias power supply preferably operates in a range of 50–1000 VDC at 10 mA maximum.

The positive terminal of the DC bias power supply is coupled to the same ground reference as the plasma chamber.

In the embodiment of the invention utilizing an RF plasma power supply for biasing the substrate with RF power during processing, the invention includes an RF matching network which has an output isolating capacitor with a voltage rating that is adequate to accommodate power from both the RF plasma power supply and the DC bias power supply.

Alternatively, when the base electrode is grounded, a second commutator switch is connected between the source of ground potential and the base electrode. The second commutator switch is operably coupled to the DC bias control circuit, and is closed during plasma processing to provide grounding of the electrode and substrate. Simultaneously, the DC bias commutator switch is normally open. At the end of the processing, the second commutator switch is open to isolate the electrode and substrate from ground potential while the DC bias switch is closed to negatively bias the substrate and prevent contamination.

The substrate is preferably kept at a negative bias potential for a few seconds during the post-processing period and during the extinguishing of the plasma, accompanied by the pumping down of the processing chamber to a high vacuum. Since the brief DC bias takes place during the established required post-processing period, the short DC biasing time does not affect the throughput of the processing chamber.

For some plasma processes, the substrates may include voltage sensitive devices which cannot handle the high DC biasing voltage necessary to repel contaminant particles from the substrate. In accordance with the principles of the another embodiment of the invention, an electrode is placed proximate to the substrate but not contacting the substrate. The electrode briefly creates an electrical field in the space above the substrate during DC biasing to repel electrically charged contaminant particles from the surface of the substrate without providing a high DC bias voltage to the substrate. Thereby, contamination is reduced while the sensitive structures of the substrate are protected.

The present invention thereby prevents contamination of the substrate and increases the yield of the plasma processing system and particularly increases the yield of VLSI devices. Furthermore, since the substrate is only briefly DC biased during the post-processing period, the overall processing cycle of the system is not increased.

The above and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
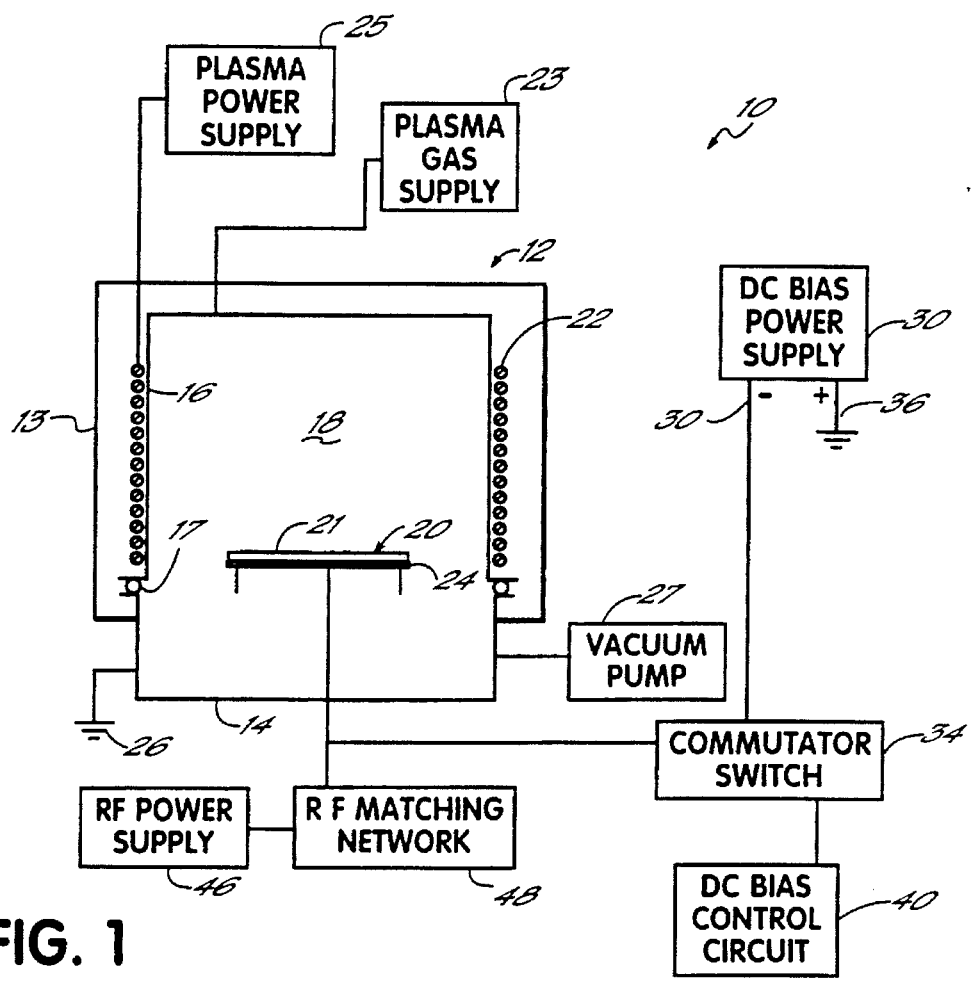
FIG. 1 is a schematic view of a plasma processing system in accordance with principles of the present invention.

FIG. 1 illustrates a plasma processing system in accordance with one embodiment of the present invention. The plasma processing system 10 typically includes a processing chamber 12 with a base 14 and a cover 16. The cover 16 and base 14 are coupled together by an airtight seal 17 so that a processing space 18 inside of chamber 12 may be evacuated as necessary for a particular plasma process, such as plasma sputter etching or plasma sputter deposition. While the present invention is particularly useful for plasma sputter etching and sputter deposition, other plasma processes such as plasma vapor deposition (PVD) and plasma enhanced chemical vapor deposition (PECVD) will benefit from the present invention. A portion of the chamber 12 may be surrounded by a shield 13.

The plasma processing chamber 12 is coupled to an appropriate plasma gas supply 23, a vacuum pump 27, and temperature control device (not shown) and includes the necessary ports therein for coupling to such systems in order to achieve the desired plasma processing of substrate 20 positioned within the processing space 18 of chamber 12.

An electrical element, such as an inductive coil 22, is appropriately positioned proximate chamber 12 to couple electrical energy into space 18 through cover 16 so that the plasma gas is excited into a plasma or plasma cloud. Coil 22 is coupled to an appropriate plasma power supply 25.

Substrate 20 is supported within processing space 18 by a substrate support or base 24 which acts as a DC electrode for the purposes of the present invention as described hereinbelow. Therefore, base 24 is electrically conductive. Chamber 12 is grounded, where necessary, to a ground potential 26. The base electrode 24 is connected to a DC bias power supply 30 and preferably is coupled to the negative terminal 32 of the DC bias power supply through a commutator switch 34 which is switchable between open and closed positions. In the embodiment of the invention as illustrated in FIG. 1, the positive terminal 36 of the DC bias power supply 30 is coupled to ground potential, which is preferably the same ground potential 26 utilized by chamber 12. A DC bias control circuit 40 is connected to the commutator switch 34 to operate the switch and selectively DC bias support electrode 24 and substrate 20.

Turning now to the operation of the present invention, when substrate 20 is being processed with a plasma, plasma gas is supplied to processing space 18 within chamber 12 and energy is inductively coupled through coil 22 into the processing space 18 and into the plasma gas to generate and activate a plasma. Other means of coupling energy into space 18 to generate a plasma may be utilized besides an inductive coil 22. As illustrated by line 42 of the timing diagram of FIG. 2, the plasma gas is introduced, and for illustrative purposes, the plasma gas supply will be designated as ON. Shortly thereafter, the power supply connected to coil 22 is placed in an ON condition, as illustrated in line 44, and energy is coupled by coil 22 into processing space 18 to generate a plasma. In FIG. 1, the base electrode 24 is connected to an RF power supply 46 through an appropriate RF matching network 48. RF energy is supplied to base electrode 24 to bias substrate 20 during plasma processing. The generated plasma either etches substrate 20 in the case of sputter etching, bombards a target (not shown) to release target particles in the case of sputter deposition or creates and enhances the deposition process in the case of PVD and PECVD, respectively.

During the plasma processing, RF power is supplied to substrate 20 and the commutator switch 34 is controlled by the DC bias control circuit 40 to be open such that DC power from the DC bias power supply 30 is not supplied to base electrode 24. The DC bias power supply 30 is thus isolated from the processing chamber 12 and plasma processing. At the end of the plasma processing, the power to coil 22 is interrupted as illustrated by the transition change from ON to OFF in line 44 of the timing in FIG. 2. Shortly thereafter, the supply of plasma gas to the processing space 18 is interrupted by the transition change from ON to OFF in line 42 of FIG. 2.

When the power to coil 22 is interrupted, the plasma is extinguished and the DC bias control circuit 40 briefly closes the commutator switch 34 and connects negative terminal 32 of the DC bias power supply 30 to base electrode 24. Substrate 20 is briefly negatively DC biased and thereby repels contaminant particles which are released from the extinguished plasma and will seek to deposit or condense onto the upper surface 21 of substrate 20. Experimentation has shown that contaminant particles generated within the processing space 18 of a plasma processing chamber generally have a negative charge. Therefore, negative DC biasing of substrate 20 repels those particles. Should it be determined that the particles are predominantly positively charged for a particular process, base support 24 can be connected to the positive terminal 36 of the DC bias power supply 30 in accordance with the principles of the present invention to repel the positively-charged contaminant particles from substrate 20.

Figure 2:
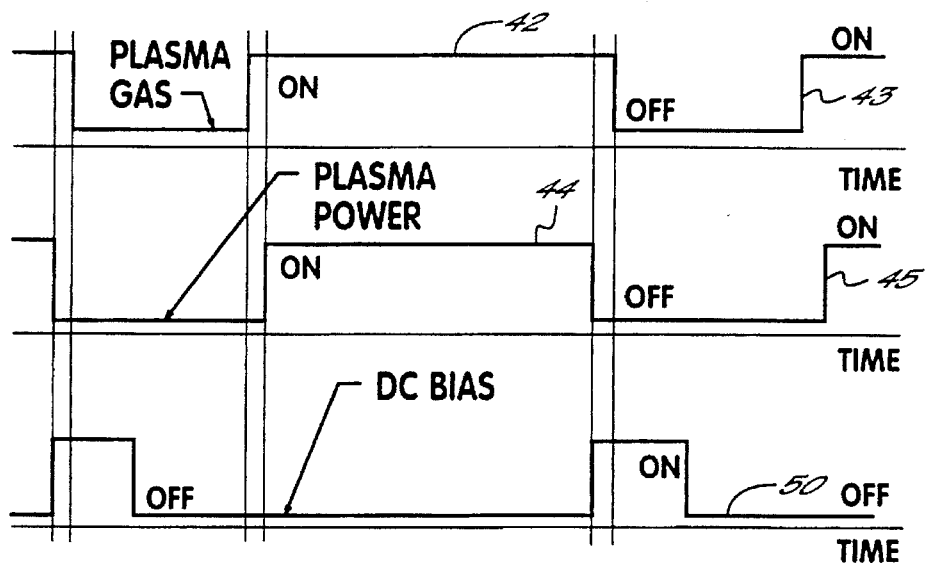
FIG. 2 is a timing diagram for operation of the DC bias control circuit.

FIG. 2 illustrates immediate closing of switch 34 and immediate DC biasing of substrate 20 upon the interruption of plasma power. However, the switch 34 might be closed before power is interrupted or shortly after power is interrupted. Providing DC bias to substrate 20 approximately at the time when power is interrupted is sufficient, as long as the DC bias does not detrimentally affect the processing and the substrate is biased in time to repel particles condensing from the extinguished plasma.

Preferably, DC bias power supply operates in a range of 50–1000 Volts at 10 mA maximum current DC to provide sufficient repulsion of the contaminant particles. Base electrode 24 and substrate 20 are kept at a negative potential typically for only a few seconds in the post-plasma processing period. As illustrated in line 50 of FIG. 2, the DC bias control circuit 40 briefly closes commutator switch 34 to turn the DC bias ON and then opens the switch 34 to turn the DC bias OFF and again isolate the substrate 20 from power supply 30. The brief DC bias occurs before the next processing cycle, which is indicated by transition 43 and transition 45 of the timing lines 42, 44 of the plasma gas supply 23 and plasma power supply 25, respectively (see FIG. 2). Therefore, the DC bias during the post-plasma processing period does not affect the overall substrate throughput of plasma chamber 12. The yield of chamber 12, however, is increased due to the repulsion of contaminant particles away from substrate 20.

Figure 3:
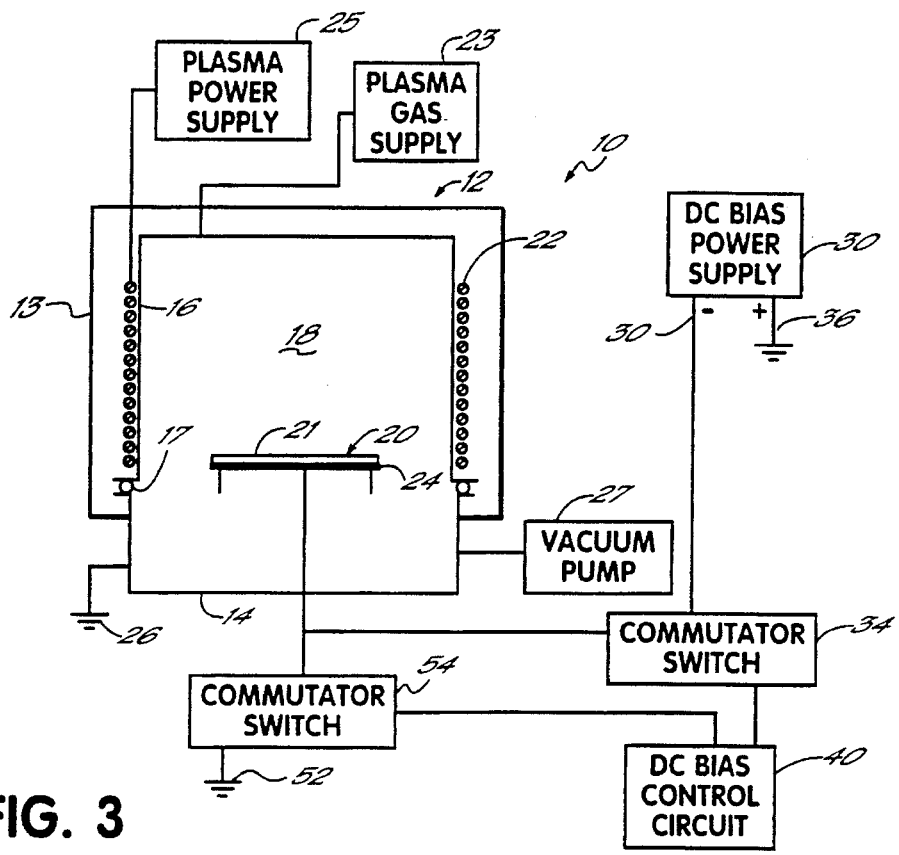
FIG. 3 is a schematic view of an alternative embodiment of a plasma processing system in accordance with the principles of the present invention; and, FIG. 4 is a schematic view of another alternative embodiment of a plasma processing system in accordance with the principles of the present invention.

In an alternative embodiment of the invention as illustrated in FIG. 3, substrate base electrode 24 is not biased by an RF power supply 46 and also is not left electrically floating, but instead is connected to a source of ground potential 52 through a commutator switch 54 which is also connected to the DC bias control circuit 40. During processing, a plasma is generated within the processing space 18 and commutator switch 54 is closed by DC bias control circuit 40 to provide grounding of base electrode 24. Simultaneously, commutator switch 34 is opened to isolate the DC bias power supply 30 from base electrode 24. At the end of plasma generation and plasma processing, the plasma is extinguished and the DC bias control circuit 40 closes commutator switch 34 to bias electrode 24 and opens the commutator switch 54 to isolate electrode 24 from ground potential 52. As discussed above, DC bias is thereby briefly supplied to electrode 24 and substrate 20 to repel negatively charged contaminant particles from the surface 21 of substrate 20.

Preferably, the present invention is utilized around an Eclipse-Mark II integrated VLSI etching and sputtering system which is available from Materials Research Corp. (MRC) of Orangeburg, N.Y. Any suitable commutator switches may be utilized with the invention such as Solid State DC output relays (RD series-RD3501-D) available from CRYDOM Company of El Segundo, California.

Figure 4:
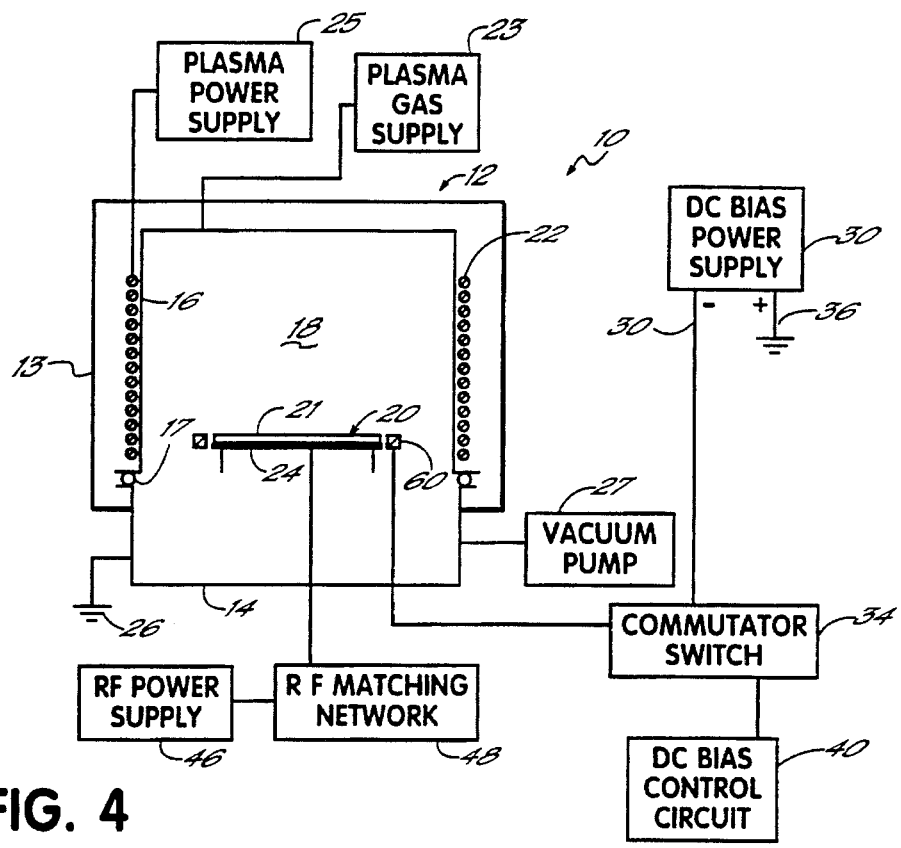

The embodiments of the invention illustrated in FIGS. 1 and 3 utilize DC biasing of the base electrode 24 which supports the substrate 20. However, some substrates may carry sensitive structures and devices and DC biasing of the substrate base 24 may be harmful to them. FIG. 4 illustrates an alternative embodiment of the invention in which an electrode 60 is placed proximate to the substrate and is coupled to an appropriate DC bias power supply 30 and DC bias control circuit 40 through a commutator switch 34 for inducing an electrical field proximate to the substrate. FIG. 4 illustrates an electrode 60 which encircles the substrate 20 and electrode 24. The electrical field created by electrode 60 around the substrate 20 electrically repels any negatively charged contaminant particles coming from the extinguished plasma. Accordingly, the electrode 60 operates similar to base electrode 24 described hereinabove. Other electrode shapes might also be utilized in accordance with the principles of the present invention to repel contaminant particles.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A plasma processing system for processing a substrate comprising:

a processing chamber having a processing space therein for containing a substrate to be processed with a plasma;

an electrical element operable to couple electrical energy into at least a portion of the processing space for generating a plasma therein to process the substrate and operable to interrupt power to the processing space so that the plasma is extinguished;

a plasma energizing source, including an electrical coupling element coupling electrical energy into at least a portion of the processing space to generate a plasma therein when said element is energized, said source being electively operable to de-energize said element and extinguish said plasma;

an electrode positioned inside the chamber and electrically coupled to the substrate;

a DC bias power supply coupled to the electrode for selectively supplying DC power to the electrode to bias the substrate; and a DC bias control circuit coupled to the DC bias power supply for selectively controlling the biasing of the substrate during a plasma processing cycle, the DC bias control circuit operable to briefly supply DC power to the electrode and substrate, approximately at the time when the coupling element is de-energized, to momentarily DC bias the substrate such that, as the plasma is extinguished, charged contaminant particles suspended within the plasma are repelled away from the biased substrate to prevent contamination of the substrate.

2. The plasma processing system of claim 1 wherein the DC bias control circuit is further operable to interrupt the DC power supplied to the electrode and substrate when a plasma is being generated.

3. The plasma processing system of claim 1 further comprising an RF power supply coupled to the electrode, the RF power supply supplying the substrate with RF power when a plasma is generated and interrupting the RF power when the plasma is extinguished, the DC bias control circuit operable to momentarily bias the substrate when the RF power to the substrate is interrupted.

4. The plasma processing system of claim 1 further comprising a switch coupling the electrode to ground potential to ground the substrate when a plasma is generated, the DC bias control circuit further operable to open the switch to remove the ground potential when the electrode is momentarily biased by the DC bias power supply.

5. The plasma processing system of claim 1 further comprising a switch connected between the electrode and the DC bias power supply, the DC bias control circuit operable to close the switch and momentarily bias the substrate as the plasma is extinguished.

6. The plasma processing system of claim 5 wherein the DC bias control circuit is further operable to open the switch and interrupt the DC power supplied to the substrate when a plasma is generated.

7. The plasma processing system of claim 1 wherein the electrode is coupled to a negative lead of the DC bias power supply such that the substrate is negatively biased to repel negatively charged contaminant particles.

8. The plasma processing system of claim 1 wherein the DC bias power supply is operable to bias the substrate in a range of approximately 50 to 1000 Volts DC.

9. A plasma processing system for processing a substrate comprising:

a processing chamber having a processing space therein for containing a substrate to be processed with a plasma;

an electrical element operable to couple electrical energy into at least a portion of the processing space for generating a plasma therein to process the substrate and operable to interrupt power to the processing space so that the plasma is extinguished;

a plasma energizing source, including an electrical coupling element coupling electrical energy into at least a portion of the processing space to generate a plasma therein when said element is energized, said source being electively operable to de-energize said element and extinguish said plasma;

an electrode positioned inside the chamber proximate to the substrate but not physically contacting the substrate;

a DC bias power supply coupled to the electrode for selectively supplying DC power to the electrode to create an electric field proximate the substrate; and a DC bias control circuit coupled to the power supply for selectively controlling the biasing of the electrode during a plasma processing cycle, the DC bias control circuit operable to briefly supply DC power to the electrode approximately at the time when the coupling element is de-energized to momentarily create said electric field proximate to the substrate such that, as the plasma is extinguished, charged contaminant particles suspended within the plasma are repelled away from the substrate to prevent contamination of the substrate and the substrate is protected from the harmful effects of direct DC biasing.

10. The plasma processing system of claim 9 wherein the DC bias control circuit is further operable to interrupt the DC power supplied to the electrode and interrupt the electric field when a plasma is being generated.

11. The plasma processing system of claim 9 further comprising a switch connected between the electrode and the DC bias power supply, the DC bias control circuit operable to close the switch and momentarily bias the electrode as the plasma is extinguished.

12. The plasma processing system of claim 11 wherein the DC bias control circuit is further operable to open the switch and interrupt the DC power supplied to the electrode when a plasma is generated.

13. The plasma processing system of claim 9 wherein the electrode is coupled to a negative lead of the DC bias power supply such that the electrode is negatively biased to repel negatively charged contaminant particles.

14. A method of processing a substrate with a plasma comprising:

positioning a substrate in the processing space of a processing chamber, the substrate being positioned on and electrically coupled to an electrode inside the chamber;

introducing a plasma gas into the processing space;

coupling electrical energy into at least a portion of the processing space and into the plasma gas for generating a plasma to process the substrate and subsequently interrupting power to the plasma to extinguish the plasma when the plasma processing is complete;

coupling a DC bias power supply to the electrode for selectively supplying DC power to the electrode to bias the substrate; and briefly supplying DC power to the electrode and substrate approximately at the time when the power to the generated plasma is interrupted to momentarily bias the substrate such that, as the plasma is extinguished, charged contaminant particles suspended within the plasma are repelled from the biased substrate to prevent contamination of the substrate.

15. The method of claim 14 further comprising interrupting the DC power supplied to the electrode and substrate when a plasma is being generated to process the substrate.

16. The method of claim 14 further comprising supplying the substrate with RF power when a plasma is generated for processing the substrate and interrupting the RF power when the plasma is extinguished, the substrate being momentarily biased when the RF power to the substrate is interrupted.

17. The method of claim 14 further comprising coupling the electrode to ground potential to ground the substrate when a plasma is generated for processing the substrate and interrupting the ground potential when the electrode is biased by the DC bias power supply.

18. The method of claim 14 wherein the DC bias power supply is coupled to the substrate through a switch, the method further comprising closing the switch and biasing the substrate when the plasma is extinguished.

19. The method of claim 18 further comprising opening the switch and interrupting the DC power supplied to the substrate when a plasma is being generated and the substrate is being processed.

20. The method of claim 14 further comprising coupling a negative lead of the DC bias power supply to the electrode such that the substrate is negatively biased to repel negatively charged contaminate particles.

21. The method of claim 14 further comprising operating the DC bias power supply to bias the substrate in a range of approximately 50 to 1000 Volts DC.

22. A method of processing a substrate with a plasma comprising:

positioning a substrate in the processing space of a processing chamber, the substrate being positioned proximate to but not contacting an electrode inside the chamber;

introducing a plasma gas into the processing space;

coupling electrical energy into at least a portion of the processing space and into the plasma gas for generating a plasma to process the substrate and subsequently interrupting power to the plasma to extinguish the plasma when the plasma processing is complete;

coupling a DC bias power supply to the electrode for selectively supplying DC power to the electrode to create an electric field proximate the substrate; and briefly supplying DC power to the electrode approximately at the time when the power to the generated plasma is interrupted to momentarily create said electric field proximate to the substrate such that, as the plasma is extinguished, charged contaminate particles suspended within the plasma are repelled away from the substrate to prevent contamination of the substrate and the substrate is protected from the harmful effects of direct DC biasing.

23. The method of claim 22 further comprising interrupting the DC power supplied to the electrode and removing the electric field when a plasma is being generated to process the substrate.

24. The method of claim 22 wherein the DC bias power supply includes a switch coupled to the output of the power supply, the method further comprising closing the switch and briefly biasing the electrode when the plasma is extinguished.

25. The method of claim 24 further comprising opening the switch and interrupting the DC power supplied to the electrode when a plasma is generated.

26. The method of claim 22 further comprising coupling the electrode to a negative lead of the DC bias power supply such that the electrode is negatively biased to repel negatively charged contaminant particles.

* * * * *